United States Patent [19]

Ueda

[11] Patent Number: 5,242,099
[45] Date of Patent: Sep. 7, 1993

[54] METHOD OF DIE BONDING SEMICONDUCTOR CHIP

[75] Inventor: Naoto Ueda, Itami, Japan

[73] Assignee: Mitsubishi Denki Kabushiki Kaisha, Tokyo, Japan

[21] Appl. No.: 843,220

[22] Filed: Feb. 28, 1992

[30] Foreign Application Priority Data

Aug. 26, 1991 [JP] Japan .................. 3-213718

[51] Int. Cl.⁵ .................. B23K 31/02; H01L 21/50
[52] U.S. Cl. .................. 228/123.1; 228/195; 228/231; 228/254
[58] Field of Search .......... 228/123, 193, 195, 124, 228/226, 231, 254, 263.12, 56.3

[56] References Cited

U.S. PATENT DOCUMENTS

| | | | |
|---|---|---|---|
| 3,339,267 | 9/1967 | Bronnes et al. | 228/124 M |
| 4,746,055 | 5/1988 | Ingram et al. | 228/195 |
| 4,772,935 | 9/1988 | Lawler et al. | 228/123 |
| 4,922,322 | 5/1990 | Mathew | 228/123 |
| 5,038,996 | 8/1991 | Wilcox et al. | 228/195 |

FOREIGN PATENT DOCUMENTS

| | | | |
|---|---|---|---|
| 17827 | 4/1981 | Japan | 228/123 |
| 118580 | 4/1981 | Japan. | |
| 34832 | 1/1983 | Japan. | |

OTHER PUBLICATIONS

IBM Technical Disclosure Bulletin, "Transient Liquid Phase Bonding Process", vol. 32, No. 4A, pp. 273, 274, Sep. 1989.
Transactions of the Metallurgical Society of AIME, ". . . SLID Bonding", Bernstein and Bartholomew, vol. 236, pp. 405–412, Mar. 1966.

Primary Examiner—Samuel M. Heinrich
Attorney, Agent, or Firm—Leydig, Voit & Mayer

[57] ABSTRACT

In a manufacturing method for a semiconductor device, first, a diffused layer of a soldering material is provided previously either on the reverse surface of a die or on the obverse surface of a die pad. Then, a diffusing layer is formed on either surface of the diffused layer. The diffusing layer between the die and the die pad is brought into contact with the die and die pad, and then these components are heated. The die is thereby and fully bonded to the die pad, even when the diffusing layer, which is an initial bonding layer, is made thinner. Because the time for the diffusing layer to diffuse can be shortened, the time for installing the die can also be shortened.

3 Claims, 2 Drawing Sheets

METHOD OF DIE BONDING SEMICONDUCTOR CHIP

BACKGROUND OF THE INVENTION

1. Field of the Invention

The present invention relates to a manufacturing method for a semiconductor device and to a semiconductor device. More particularly, it pertains to a manufacturing method for a semiconductor device in which, in a die-bonding step, one of the steps of assembling the semiconductor device, a solder foil is used to bond a die to a die pad through a liquid phase, diffusing bonding, and it also pertains to a semiconductor device manufactured by such a method.

2. Description of the Related Art

FIG. 4 is a sectional side elevation schematically showing a die of a conventional semiconductor device before the mounting of the die. As shown in FIG. 4, the die 1 of a semiconductor element is bonded to a die pad 3 through a soldering material 2. The soldering material 2 is a foil-like bonding material including a diffused layer 4, which is an intermediate layer having a relatively high melting point, such as 95 wt. % Pb-5 wt. % Sn or Sn and diffusing layers 5, which are outer layers having a low melting point, relative to the diffused layer 4, such as 65 wt. % Sn-35 wt. % Pb when the diffused layer 4 is 95 wt. % Pb-5 wt. % Sn or 95 wt. % Pb-5 wt. % Sn when the diffused layer 4 is Sn. The diffusing layers 5 are laminated on diffused layer 4.

The conventional semiconductor device is constructed as described above. When the die 1 is bonded to the die pad 3, the diffusing layers 5 serve as initial bonding layers because the reverse surface of the die 1 and the obverse surface of the die pad 3 are heat-treated. In other words, because of the heat treatment, first, the diffusing layers 5, having a low melting point, melt, and then the soldering material 2 is bonded to the die 1 and the die pad 3. When these components are maintained at a predetermined temperature, metal in the diffusing layers 5 diffuses into the diffused layer 4, and the composition of the soldering material 2 becomes uniform, thus gaining desired characteristics. The die 1 and the die pad 3 can be bonded together in this way.

In the semiconductor device as described above, in order to fully obtain initial bonding, since the diffused layer 4 is covered with the diffusing layers 5, one diffusing layer 5 must be bonded to the reverse surface of the die 1 and the other diffusing layer 5 must at the same time be bonded to the obverse surface of the die pad 3. The soldering material 2 must be thicker than a predetermined value in order to fully obtain the initial bonding and to compensate for the effect on the configurations of the die 1 and the die pad 3. After the initial bonding, the metal in the diffusing layers 5 diffuses further into the diffused layer 4 because of the heat treatment. While the metal is diffusing, when part of one diffusing layer 5 and part of the other diffusing layer 5 are superposed on each other at the center of the diffused layer 4, the concentration gradients of the compositions of the diffused layer 4 and the diffusing layers 5 become smaller. Therefore, the diffusion rate of the metal tends to decrease. For the above reasons, it takes an enormous amount of time for the soldering material 2 to be heated before the composition of the material 2 becomes uniform.

SUMMARY OF THE INVENTION

The present invention has been made to solve the above problem. Accordingly, the object of this invention is to provide a manufacturing method for a semiconductor device in which a diffusing layer of a soldering material can be thinned and the amount of time for installing a die can be shortened, and to provide a semiconductor device manufactured by such a method.

In order to achieve the above object, according to one aspect of the present invention, there is provided a manufacturing method for a semiconductor device in which a die is bonded to a die pad through a soldering material, the manufacturing method comprising the steps of: providing a diffused layer of the soldering material either on a reverse surface of the die or on an obverse surface of the die pad; forming a diffusing layer of the soldering material on either surface of the diffused layer; and bonding the die to the die pad by bringing the diffusing layer interposed between the die and the die pad into contact with the die and the die pad, and by heating these components.

According to another aspect of this invention, there is provided a semiconductor device comprising: a die; a die pad on which the die is mounted; and a soldering material which bonds the die to the die pad, and which is composed of a diffused layer and a diffusing layer; wherein the diffused layer of the soldering material is provided either on a reverse surface of the die of on an obverse surface of the die pad, the diffusing layer being disposed on both surfaces of the diffused layer, the die is bonded to the die pad by the diffusing layer between the die and the die pad.

DESCRIPTION OF THE PREFERRED EMBODIMENTS

Figure 1:
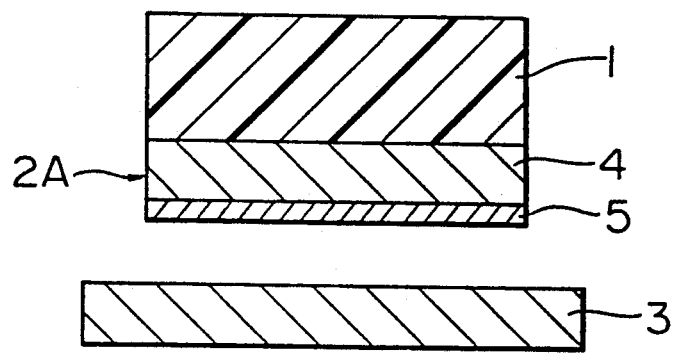
FIG. 1 is a sectional side elevation schematically showing a die of a semiconductor device according to an embodiment of the present invention before the mounting of the die.

FIG. 1 is a sectional side elevation schematically showing a die of a semiconductor device according to an embodiment of the present invention before the mounting of the die. Throughout the drawings, components denoted by the same numerals are the same or corresponding components. As shown in FIG. 1, a soldering material 2A is composed of a diffused layer 4 and a diffusing layer 5. The diffused layer 4 is disposed on the reverse surface of the die 1. The diffusing layer 5 is disposed on the reverse surface of the diffused layer 4.

In the thus-constructed semiconductor device, first, the diffused layer 4 is formed on the reverse surface of the die 1 by a method, such as an evaporating method or a plating method. Next, the diffusing layer 5 is formed on the reverse surface of the diffused layer 4, Then, the diffusing layer 5 is brought into contact with the obverse surface of a die pad 3, and these components are heated and thereby bonded together. Because the diffusing layer 5 is formed on the diffused layer 4, the smooth surface of the diffused layer 4 can reduce the thickness of the diffusing layer 5. Since the diffusing layer 5 is formed on only one surface of the diffused layer 4, the concentration gradient can be kept constant while the diffusing layer 5 is diffusing into the diffused layer 4. It is thus possible to diffuse the diffusing layer 5 in a short period of time. As a result, the amount of time for mounting the die can be shortened.

Figure 2:
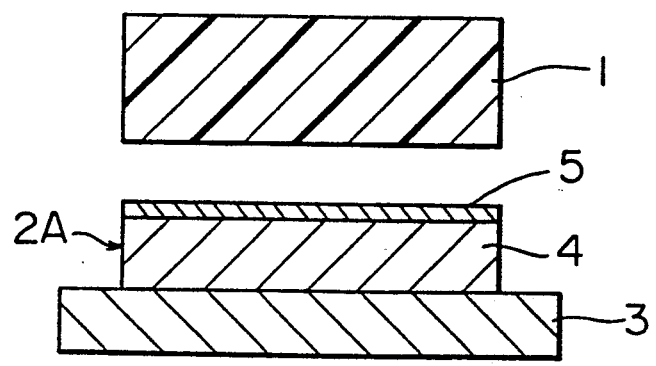
FIG. 2 is a sectional side elevation schematically showing a die of a semiconductor device according to another embodiment of this invention before the mounting of the die.
Figure 3:
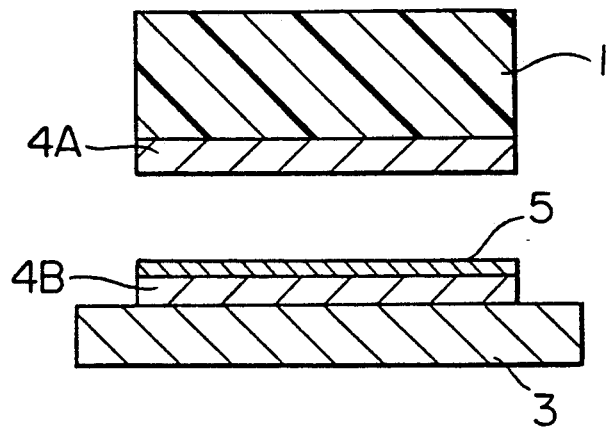
FIG. 3 is a sectional side elevation schematically showing a die of a semicondutor device according to a further embodiment of the invention before the mounting of the die.
Figure 4:
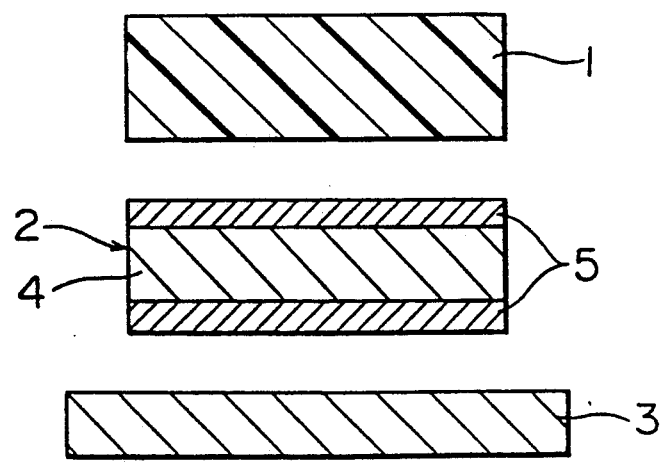
FIG. 4 is a sectional side elevation schematically showing the die of the conventional semiconductor device before the mounting of the die.

In the above embodiment, the diffused layer 4 is provided on the reverse surface of the die 1, however, it may also be provided on the obverse surface of the die pad 3, as shown in FIG. 2, and the same advantages as those described above can be obtained. In addition, as shown in FIG. 3. tlhe diffused layer 4 may be divided into two diffused layers 4A and 4B. The diffused layers 4A and 4B may be provided on the reverse surface of the die 1 and the obverse surface of the die pad 3, respectively. The diffusing layer 5 is provided either on the diffused layer 4A or on the diffused layer 4B. The same advantages as those described above are obtainable with such a construction.

What is claimed is:

1. A manufacturing method for a semiconductor device in which a die is bonded to a die pad with a soldering material comprising:
   forming a diffused layer of a soldering material on a reverse surface of a semiconductor die;
   forming a diffusing layer of the soldering material on the diffused layer; and
   bonding the semiconductor die to a die pad by bringing the diffusing layer into contact with the die pad and heating the semiconductor die and die pad to diffuse a component from the diffusing layer into the diffused layer.

2. A manufacturing method for a semiconductor device in which a die is bonded to a die pad with a soldering material comprising:
   forming a diffused layer of a soldering material on an obverse surface of a die pad;
   forming a diffusing layer of the soldering material on the diffused layer; and
   bonding a semiconductor die to the die pad by bringing the diffusing layer into contact with the semiconductor die and heating the semiconductor die and the die pad to diffuse a component from the diffusing layer into the diffused layer.

3. A manufacturing method for a semiconductor device in which a die is bonded to a die pad with a soldering material comprising:
   forming a first diffused layer of a soldering material on an obverse surface of a die pad;
   forming a diffusing layer of the soldering material on the diffused layer;
   forming a second diffused layer of a soldering material on a semiconductor die; and
   bonding the semiconductor die to the die pad by bringing the diffusing layer into contact with the second diffused layer and heating the semiconductor die and the die pad to diffuse a component from the diffusing layer into the first and second diffused layers.

* * * * *